United States Patent [19]

Favreau et al.

[11] Patent Number: 4,458,207

[45] Date of Patent: Jul. 3, 1984

[54] FM DEMODULATOR WITH VARIABLE BANDPASS FILTER

[75] Inventors: Michel Favreau; André Marguimaud; both of Paris, France

[73] Assignee: Thomson-CSF, Paris, France

[21] Appl. No.: 302,783

[22] Filed: Sep. 16, 1981

[30] Foreign Application Priority Data

Sep. 16, 1980 [FR] France ............................. 80 19921

[51] Int. Cl.³ ......................... H03D 3/00; H04B 1/10
[52] U.S. Cl. .................................... 329/136; 329/139; 329/140; 455/205; 455/266
[58] Field of Search .............. 329/136, 137, 139, 140; 375/97, 99, 102, 103; 455/205, 208, 212, 213, 222, 225, 266, 303, 312; 358/23, 24, 25, 167; 328/167

[56] References Cited

U.S. PATENT DOCUMENTS

| | | | |
|---|---|---|---|
| 3,218,641 | 11/1965 | Maynard | 455/266 X |
| 3,629,716 | 12/1971 | Dimon | 329/50 |
| 3,978,416 | 8/1976 | Sutphin, Jr. | 328/167 |
| 4,045,740 | 8/1977 | Baker | 455/266 |
| 4,101,837 | 7/1978 | Clayton, Jr. et al. | 329/139 X |
| 4,339,828 | 7/1982 | Chasek | 455/266 X |
| 4,356,568 | 10/1982 | Ogita et al. | 455/266 X |

FOREIGN PATENT DOCUMENTS 674935 7/1966 France .
2400298 3/1979 France .

Primary Examiner—Siegfried H. Grimm
Assistant Examiner—W. R. Paxman
Attorney, Agent, or Firm—Cushman, Darby & Cushman

[57] ABSTRACT

The demodulator combines a conventional frequency discriminator with a bandpass filter for removing the noise which is present from the band occupied at a given instant by the modulated signal. The center frequency of the bandpass filter is controlled in dependence on the instantaneous frequency of the modulated signal and its bandwidth $b_u$ is controlled in dependence on the instantaneous width of the band occupied by the modulated signal.

5 Claims, 3 Drawing Figures

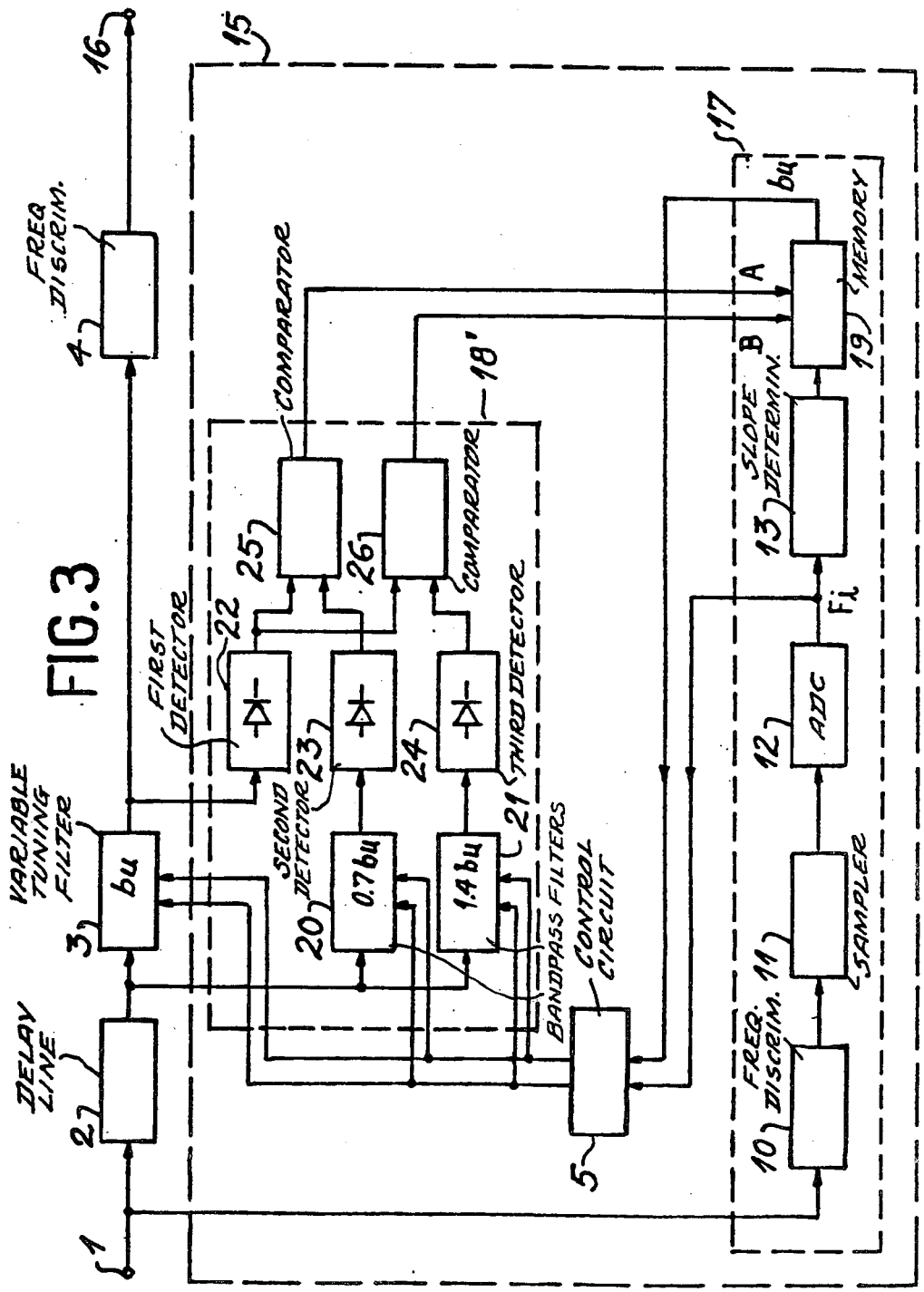

FM DEMODULATOR WITH VARIABLE BANDPASS FILTER

This invention relates to demodulators for frequency-modulated signals and in particular to demodulators employed in television systems.

It is a known practice to demodulate frequency-modulated signals by means of conventional frequency discriminators. From the point of view of noise resistance, however, these conventional discriminators behave in the same manner as constant bandwidth amplitude demodulators. In other words, the resultant signal-to-noise ratio is proportional to the frequency bandwidth of the signal to be demodulated.

In the long term, however, the signal to be demodulated may occupy a very wide total frequency band, thus resulting in a very poor signal-to-noise ratio. This total frequency band occupied by the signal constitutes the so-called long-term spectrum.

The aim of the present invention is to achieve a very distinct improvement in the signal-to-noise ratio of conventional discriminators by taking into account at each moment the instantaneous frequency and the instantaneous frequency bandwidth occupied by the signal to be demodulated.

In fact, when frequency variations are very slow compared with the center frequency of the modulated wave, it can be considered that a "useful" bandwidth is centered on the instantaneous frequency of the signal and undergoes a relatively slow displacement within the total band occupied by the signal. This "useful" frequency band constitutes the so-called short-term spectrum.

French Patent No. FR-A-2,400,298 describes a demodulating device which reduces the noise by making use of a bandpass filter designed in two sections:
- a first bandpass filter whose central frequency is controlled so as to follow the instantaneous frequency of the modulated signal when the variations in this frequency are slow; the bandwidth of this filter is narrow in comparison with the maximum bandwidth of the modulated signal. The noise is consequently reduced;
- a second bandpass filter whose bandwidth is equal to the maximum bandwidth of the signal is switched in parallel with the first filter in order to make it inoperative when the frequency variations are fast and therefore entail the need for a wide passband.

The passband of the above device therefore has only two possible values. Thus the demodulated signal is distorted when the bandwidth is too small and noise is allowed to pass when the bandwidth is too large. The aim of the device according to the invention is to overcome these disadvantages.

According to the invention, the demodulator for a frequency-modulated signal comprises:
- a bandpass filter having a first control input for adjusting its center frequency, a second control input for adjusting the width of its passband, a third input for receiving the modulated signal, and one output;
- a frequency discriminator having one input connected to the output of the filter and one output constituting the demodulator output for delivering the modulation signal;
- a control system having a first input for receiving the modulated signal, a second input connected to the output of the frequency discriminator; the control system comprising computation means for computing a value $F_i$ of the instantaneous frequency of the modulated signal and for computing as a function of the rate of variation of the modulation signal a value $b_u$ of the instantaneous width of the frequency band occupied by the modulated signal; said control means have a first output connected to the first control input of the filter for delivering a signal which is a function of $F_i$ to said filter in order to adjust the center frequency to the value $F_i$, and a second output connected to the second control input of the filter for delivering a signal which is a function of $b_u$ to said filter in order to adjust the bandwidth to the value $b_u$.

Other features of the invention will be more apparent upon consideration of the following description and accompanying drawings, wherein:

FIG. 3 illustrates a third embodiment of the frequency demodulator according to the invention.

Figure 1:
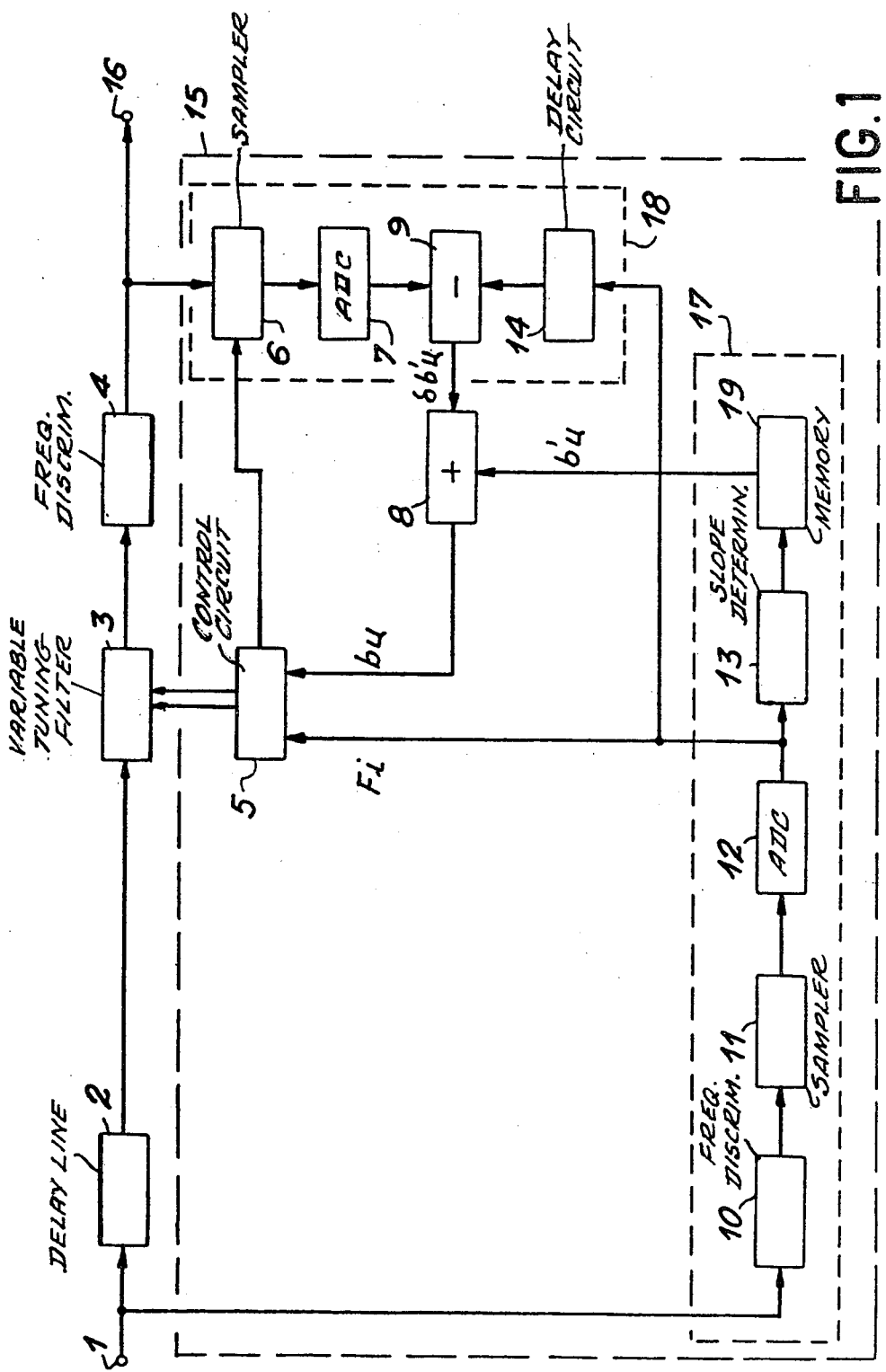
FIG. 1 illustrates a first embodiment of the frequency demodulator according to the invention.

The first embodiment of the demodulator according to the invention as described hereinafter with reference to FIG. 1 comprises two processing channels.

A first channel is constituted by a delay line 2, a variable-tuning filter 3 and a conventional frequency discriminator 4 disposed respectively in series between an input terminal 1 for receiving a suitably amplified and prefiltered frequency-modulated signal and an output terminal 16 for delivering the modulation signal.

In accordance with the principle of the invention, the filter 3 is a bandpass filter having two control inputs for receiving two tuning control signals (center frequency and passband width) which are functions of the instantaneous frequency and of the "useful" frequency band of the modulated signal. Thus, by virtue of this adaptation of tuning, the signal-to-noise ratio produced by the frequency discriminator 4 is distinctly better than the ratio obtained when the filter is of the fixed-tuning type. In fact, a fixed-tuning filter has a fixed passband at least equal to the total bandwidth of the modulated signal.

The delay introduced by the delay line 2 corresponds to the time required by a second channel of the demodulator to deliver the filter-tuning control signal.

Said second channel is constituted by a unit 17 for determination of the instantaneous frequency $F_i$ and of the "useful" frequency band $b'_u$ of the signal, having an input connected to the input terminal 1, a first output for delivering the frequency $F_i$, and a second output for delivering the frequency $b'_u$, and by a control circuit 5 having a first input connected to the first output of the frequency determination unit 17, a second input coupled to the second output of the frequency determination unit 17 via a summing circuit 8, and two outputs connected respectively to the two control inputs of the filter 3. The outputs of the control circuit 5 deliver the signals which control tuning of the filter 3 as a function of $F_i$ and $b'_u$.

The frequency determination unit 17 is constituted by a conventional frequency discriminator 10, a sampler 11, an analog-to-digital converter 12, a slope determination device 13, and a memory 19.

The conventional frequency discriminator 10 comprises an input connected to the input terminal 1 to which is applied the signal to be demodulated and an output which delivers the modulation signal. This signal is sampled by the sampler 11, then converted to a series of numerical values by the analog-to-digital converter 12. The output of said analog-to-digital converter 12 is connected to the first input of the control circuit 5 and delivers numerical samples of the modulation signal which correspond to the values of the instantaneous frequency $F_i$ of the modulated signal.

In regard to the values of the "useful" bandwidth $b'_u$, said values are supplied by the memory 19, the address input of which is connected to the output of the slope determination device 13, the input of which is connected to the output of the analog-to-digital converter 12. Said determination device 13 delivers at its output the values of the slope of the amplitude-time curve of the modulation signal. These values of slope are determined by the method of least squares from five samples.

In respect of each value of slope delivered by the determination device 13, the memory 19 supplies the corresponding value $b'_u$ of the "useful" frequency band. This value $b'_u$ is approximate since the method of calculation is simplified in order to facilitate its practical application. Furthermore, there are some cases where noise may impair the accuracy of estimation of the value $b'_u$. For this reason, provision is made for a correcting device which modifies the values delivered by the memory 19 by taking into account an estimation $\delta b'_u$ of the error made in these values.

In order to modify the "useful" frequency band values $b'_u$, the auxiliary determination unit accordingly comprises on the one hand a unit 18 for estimating the value of the error $\delta b'_u$ and on the other hand the summing circuit 8.

The estimation unit 18, the first and second inputs of which are connected respectively to the output of the frequency discriminator 4 and to the output of the digital-to-analog converter 12, compares the modulation signals delivered by each processing channel. Thus the estimation unit 18 is constituted by a sampler 6, the input of which is connected to the output of the frequency discriminator 4, an analog-to-digital converter 7 having an input connected to the output of the sampler 6, a delay circuit 14 having an input connected to the output of the analog-to-digital converter 12, and a subtracting circuit 9 having a first and a second input connected to the output of the analog-to-digital converter 7 and to the output of the delay circuit 14.

The sampler 6 delivers samples of the modulation signal supplied by the output of the frequency discriminator 4. These samples are then converted to numerical values by the analog-to-digital converter 7, then compared by the subtracting circuit 9 with the samples supplied by the analog-to-digital converter 12, that is, to the samples of the modulation signal delivered by the frequency discriminator 10. The delay circuit 14 has a time-delay equivalent to the difference in processing time for producing the samples to be compared.

The subtracting circuit 9 therefore delivers an error signal which is employed as an estimation $\delta b'_u$ of the shortfall error involving the "useful" bandwidth values $b'_u$ determined by the frequency determination device 17. The summing circuit 8, the first and second inputs of which are respectively connected to the output of the subtracting circuit 9 and to the output of the memory 19, adds $b'_u$ to $\delta b'_u$ and delivers $b_u = b'_u + \delta b'_u$ at its output.

Since the output of the summing circuit 8 is connected to the second input of the control circuit 5, the circuit delivers two control signals for tuning the filter 3 as a function of $F_i$ and of $b_u$.

The clock frequency of the sampler 6 is controlled by a signal delivered by the control circuit 5 in order to maintain synchronism between the samples delivered by the sampler 6 and those delivered by the sampler 11 in spite of the phase variations caused by the variations in characteristics of the filter 3.

The correcting means 18 are capable of detecting only signal distortions caused by a bandwith which is too small and can therefore correct only a shortfall error made in the estimation of $b_u$. An overshoot error is less objectionable and gives rise to slightly more noise than in the case of an optimum "useful" bandwidth $b_u$.

The complete assembly of elements consisting of the frequency determination unit 17, the control circuit 5, the summing circuit 8 and the error estimation unit 18 will be designated hereinafter as a filter-tuning control system 15.

Figure 2:
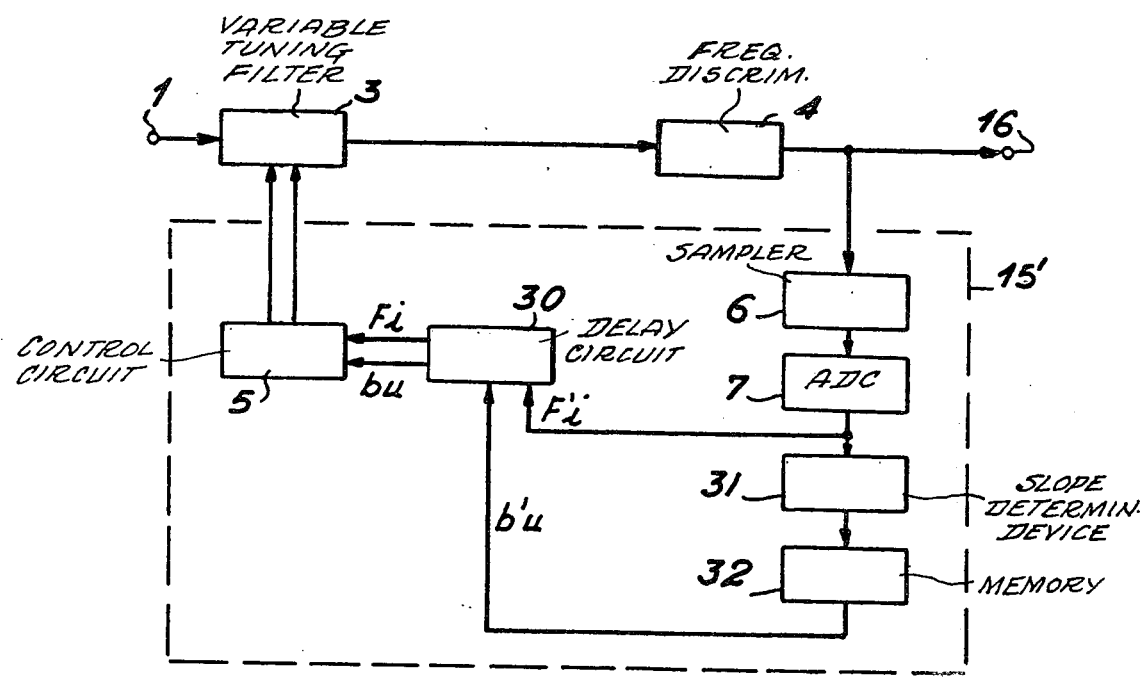
FIG. 2 illustrates a second embodiment of the frequency demodulator according to the invention, this embodiment being more particularly adapted to demodulation of a television signal.

The second embodiment of the demodulator according to the invention as shown in FIG. 2 is primarily suitable for a frequency-modulated television signal and is more simple than the preceding embodiment.

In the field of television, it is known that there is a close correlation between adjacent lines which makes it possible to obtain an a priori estimation of the "useful" bandwidth of the signal. In fact, it is only necessary to employ for each line the "useful" bandwidth values which have been determined in the preceding line.

To this end, the filter-tuning control system 15 is modified as shown in FIG. 2.

In this figure, the terminal 1 for receiving the modulated signal is connected directly to the input of the variable-tuning filter 3. The delay line 2 has therefore been dispensed with. The output of the filter 3 is still coupled to the terminal 16 via the frequency discriminator 4.

A tuning control system 15' performs the same functions as the control system 15 shown in FIG. 1. The structure of the two systems, however, is different.

The only components retained in this embodiment are the sampler 6, the analog-to-digital converter 7 and the control circuit 5. A delay circuit 30, a slope determination device 31 and a memory 32 have been added.

The operation of the control system 15' is as follows :

The modulation signal delivered by the frequency discriminator 4 is sampled by the sampler 6 and converted to a numerical value by the analog-to-digital converter 7.

The converter 7, the output of which is connected to a first input of the delay circuit 30, therefore delivers numerical samples corresponding to values $F'_i$ of the instantaneous frequency of the modulation signal. The slope determination device 31 and the memory 32 are coupled in series between the output of the analog-to-digital converter 7 and a second input of the delay circuit 30 and have the same function as the elements 13 and 19 shown in FIG. 1. They therefore supply to the second input of the delay circuit 30 the values $b'_u$ of the "useful" bandwidth of the signal.

The delay circuit 30 exhibits a time-delay equal to the duration of one television line and has two outputs coupled respectively to the two inputs of the control circuit 5. Thus the output of the control circuit 5 delivers two control signals for tuning the filter as a function of the values $F_i$ and $b_u$ which are chosen so as to be equal to the values $F'_i$ and $b'_u$ of the instantaneous frequency and of the "useful" bandwidth of the signal corresponding to the previous line.

FIG. 3 shows a third embodiment of the invention which is similar to that of FIG. 1 but in which the error estimation means 18 described earlier are replaced by estimation means 18' which operate on a different principle. The correction of $b'_u$ is not performed by adding a correction to this value but by modifying the address supplied to the memory 19 in order to read in this latter another value of $b'_u$. The error is not estimated by comparing the filtered demodulated signal and the nonfiltered demodulated signal but by comparing the energy of the non-demodulated signal which has been filtered by passing a band having a width $b_u$ with the energies of the signal obtained by passing a band having a width of 0.7 $b_u$ and a band having a width of 1.4 $b_u$. If the energy of the signal at the output of the filter having a bandwidth of 1.4 $b_u$ is greater than the energy at the output of the filter having a bandwidth of $b_u$, the value of $b_u$ is too small. If the energy of the signal at the output of the filter having a bandwidth $b_u$ is equal to the energy of the signal at the output of the filter having a bandwidth of 0.7 $b_u$, the value of $b_u$ is too high. In all the other cases, the value of $b_u$ can be considered as correct.

The error estimation means 18' comprise a bandpass filter 20 having a bandwidth of 0.7 $b_u$ and a bandpass filter 21 having a bandwidth of 1.4 $b_u$. In the same manner as the bandpass filter 3 having a bandwidth $b_u$, these two filters receive two signals which are functions of the values $F_i$ and $b_u$ and control respectively their center frequency and their passband. In addition, said filters receive the modulated signal supplied by the delay line 2. The output of the filter 3 having a bandwidth $b_u$ is connected on the one hand to the frequency discriminator 4 and on the other hand to a first detector 22. The output of the bandpass filter having a bandwidth of 0.7 $b_u$ is connected to a second detector 23 and the output of the bandpass filter having a bandwidth of 1.4 $b_u$ is connected to a third detector 24. The outputs of the first and second detectors 22 and 23 are connected respectively to the two inputs of a first comparator 25 and this latter delivers a logical signal A which is equal to 1, for example, if the signals present at these inputs have the same value. Said logical signal is delivered to a first addressing input of the memory 19.

The outputs of the first and third detectors 22 and 24 are connected respectively to the first input and to the second input of a second comparator 26. Said comparator delivers a logical signal B which is equal to 1, for example, when the value which is present at the second input is higher than the value which is present at the first input. This logical signal is delivered to a second addressing input of the memory 19. Said memory has a third addressing input for receiving the value of the rate of variation of the modulation signal, said value having been calculated by the slope determination device 13.

The variable-tuning filters employed may be either mechanical filters tuned by means of selsyns or electric filters either of the band-stop type or of the YIG filter type (Yttrium-Iron-Garnet filter).

The invention is not limited to the embodiments described in the foregoing with reference to the accompanying drawings. Many alternative embodiments may be contemplated, especially in regard to the design concept of a matchable filter and of a device for determining the instantaneous frequency and the "useful" passband of the modulated signal.

What is claimed is:

1. A demodulator for a frequency-modulated signal, comprising:
    a bandpass filter having a first control input for adjusting its center frequency, a second control input for adjusting the width of its passband, a third input for receiving the modulated signal, and one output;
    a frequency discriminator having one input connected to the output of the filter and one output constituting the demodulator output for delivering the modulation signal;
    a control system comprising computation means for computing a value $F_i$ of the instantaneous frequency of the modulated signal and for computing, as a function of the rate of variation of the modulation signal, a value $b_u$ of the instantaneous width of the frequency band occupied by the modulated signal, said control means being provided with a first output connected to the first control input of the filter for delivering a signal which is a function of $F_i$ to said filter in order to adjust the center frequency to the value $F_i$, and a second output connected to the second control input of the filter for delivering a signal which is a function of $b_u$ to said filter in order to adjust the bandwidth to the value $b_u$.

2. A demodulator according to calim 1 for demodulating a television signal, wherein the computation means comprise:
    a first computation unit having an input connected to the output of the discriminator and an output for supplying a value $F'_i$ of the instantaneous frequency of the modulated signal;
    a second computation unit having an input connected to the output of the first computation unit and an output for supplying a value $b'_u$ of the instantaneous width of the frequency band occupied by the modulated signal;
    a delay circuit having two inputs connected respectively to the outputs of the first computation unit and of the second computation unit and having two outputs for delaying values $F'_i$ and $b'_u$ for a time corresponding to one image line, and delivering delayed values constituting values $F_i$ and $b_u$ respectively.

3. A demodulator according to claim 1, wherein the computation means comprise:
    a computation unit having a first input for receiving the value $F_i$, a second input for receiving a logical signal A, a third input for receiving a logical signal B, and an output, for computing the value $b_u$;
    correcting means comprising: two bandpass filters each having two control inputs connected respectively to the first putput and to the second output of the control system in order to adjust their center frequency to the value $F_i$ and their respective passband width to the values 0.7 $b_u$ and 1.4 $b_u$, said two filters being each provided with one signal input which is common with the filter having a passband width $b_u$ and being each provided with one output; a first, a second and a third detector connected respectively to the outputs of the filters having a bandwidth $b_u$, 0.7 $b_u$, 1.4 $b_u$, in order to determine the value of the energy of the signals which are present at said outputs; a first comparator having two inputs connected respectively to the outputs of the first detector and of the second detector and having one output for delivering the logical signal A to the computation unit when the energy detected by the first detector is equal to the energy detected by the second detector in order that the value $b_u$ supplied should be reduced in this case;

a second comparator having two inputs connected respectively to the outputs of the first detector and of the third detector and having one output for delivering the logical signal B to the computation unit when the energy detected by the first detector is lower than the energy detected by the third detector in order that the value $b_u$ supplied should be increased in the case.

4. A demodulator according to claim 1, wherein the computation means comprise:

a computation unit having one input for receiving the value $F_i$ and one output, for computing an approximate value $b'_u$ of the instantaneous width of the frequency band occupied by the modulated signal;

a unit for estimating an absolute value $\delta b'_u$ of the error made in the value $b'_u$ when said value is vitiated by a shortfall error, said unit being provided with a first input for receiving the value $F_i$ and a second input connected to the output of the discriminator and one output, for computing the value $\delta b'_u$ as a function of the difference between the modulation signal extracted from the modulated signal filtered by the filter and the modulation signal extracted from the non-filtered modulated signal;

a summing circuit having a first input connected to the output of the computation unit, a second input connected to the output of the estimating unit, and one output for supplying the value $b_u = b'_u + \delta b'_u$.

5. A demodulator according to claim 4, wherein the estimating unit comprises:

a sampler having one input coupled to the output of the discriminator and one output;

an analog-to-digital converter having one input connected to the output of the sampler and one output;

a delay circuit having one input for receiving the value $F_i$ and one output, to delay this value with a time such that delayed value $F_i$ corresponds to a same modulated signal sample as the value supplied by the analog-to-digital converter;

a subtracting circuit having a first input connected to the output of the converter and a second input connected to the output of the delay circuit and having one output for supplying the value $\delta b'_u$.

* * * * *